(12) United States Patent
Kleemann et al.

(10) Patent No.: US 11,929,391 B2
(45) Date of Patent: Mar. 12, 2024

(54) ELECTRONIC COMPONENT AND METHOD OF OPERATING AN ELECTRONIC COMPONENT

(71) Applicant: Technische Universitat Dresden, Dresden (DE)

(72) Inventors: Hans Kleemann, Dresden (DE); Matteo Cucchi, Dresden (DE); Karl Leo, Dresden (DE); Veronika Scholz, Gaustritz (DE); Hsin Tseng, Dresden (DE); Alexander Lee, Dresden (DE)

(73) Assignee: Technische Universitat Dresden, Dresden (DE)

( * ) Notice: Subject to any disclaimer, the term of this patent is extended or adjusted under 35 U.S.C. 154(b) by 40 days.

(21) Appl. No.: 17/753,106

(22) PCT Filed: Oct. 1, 2020

(86) PCT No.: PCT/EP2020/077504
§ 371 (c)(1),
(2) Date: Feb. 18, 2022

(87) PCT Pub. No.: WO2021/069298
PCT Pub. Date: Apr. 15, 2021

(65) Prior Publication Data
US 2022/0320264 A1 Oct. 6, 2022

(30) Foreign Application Priority Data
Oct. 8, 2019 (DE) .......................... 10 2019 127 005

(51) Int. Cl.
*H10K 10/50* (2023.01)
*G06N 3/065* (2023.01)
(Continued)

(52) U.S. Cl.
CPC .............. *H01L 28/60* (2013.01); *H01L 28/55* (2013.01)

(58) Field of Classification Search
CPC ......... H01L 28/60; H01L 28/55; H10K 10/50; G06N 3/065
See application file for complete search history.

(56) References Cited

U.S. PATENT DOCUMENTS

| 2008/0150672 A1* | 6/2008 | Lian | ..................... H10K 19/202 338/20 |
| 2013/0175513 A1* | 7/2013 | Ford | ..................... H10K 10/50 257/40 |

(Continued)

OTHER PUBLICATIONS

Gerasimov et al, An Evolvable Organic Electrochemical Transistor for Neuromorphic Applications; Feb. 4, 2019; Advacned Science; https://doi.org/10.1002/advs.201801339 (pp. 1-8) (Year: 2019).*

(Continued)

*Primary Examiner* — Omar F Mojaddedi
(74) *Attorney, Agent, or Firm* — BARNES & THORNBURG LLP; Jeffrey R. Stone

(57) ABSTRACT

Described herein is an electronic component that may include a substrate, wherein the substrate may include at least two electrodes, wherein the at least two electrodes are each spaced apart from each other on and/or within the substrate. When the electronic component is in a first operating state, an electrolytic material may be disposed at least in a spatial region between the at least two electrodes, wherein the electrolytic material comprises at least one polymerizable material. When the electronic device is in a second operating state, at least one electrical connection may be made between the at least two electrodes, wherein the at least one electrical connection comprises an electrically conductive polymer. The electrically conductive polymer may comprise one or more fiber structures, wherein the one (Continued)

or more fiber structures are in physical contact with the at least two electrodes.

19 Claims, 10 Drawing Sheets

(51) Int. Cl.
*H01L 49/02* (2006.01)
*H10K 10/00* (2023.01)

(56) References Cited

U.S. PATENT DOCUMENTS

| 2017/0047513 | A1* | 2/2017 | Rolandi | H01L 23/5226 |
| 2018/0013082 | A1* | 1/2018 | Allen | H01L 27/1259 |
| 2019/0214557 | A1 | 7/2019 | Bahar | |
| 2020/0096475 | A1* | 3/2020 | Scavetta | G01N 27/4146 |
| 2022/0085309 | A1* | 3/2022 | Capitao | H10K 10/82 |
| 2022/0334078 | A1* | 10/2022 | Capitao | G01N 27/4146 |

OTHER PUBLICATIONS

Gerasimov et al. "An Evolvable Organic Electrochemical Transistor for Neuromorphic Applications", Adv. Sci 2019, 8 pgs.
van de Burgt, et al. "A non-volatile organic electrochemical device as a low-voltage artificial synapse for neuromorphic computing", Nature Materials, vol. 16, Apr. 2017, pp. 414-418.
Koizumi et al. "Electropolymerization on wireless electrodes towards conducting polymer microfbre networks", nature communications, received Jul. 28, 2015, accepted Dec. 7, 2015, published Jan. 25, 2016, 6 pgs.

* cited by examiner

ELECTRONIC COMPONENT AND METHOD OF OPERATING AN ELECTRONIC COMPONENT

CROSS-REFERENCE TO RELATED APPLICATIONS

This is a national phase application of PCT/EP2020/077504, filed on Oct. 1, 2020, which claims priority to German Application DE 10 2019 127 005.7, filed on Oct. 8, 2019, the contents of each of which are incorporated herein by reference in their entirety.

TECHNICAL FIELD

This disclosure relates to an electronic device and a method of operating an electronic device.

BACKGROUND

Artificial neural networks (also referred to as artificial neural networks), for example, are networks of artificial neurons. Currently, artificial neural networks represent a basic building block of artificial intelligence. Such networks are characterized, for example, by a high degree of interconnectivity between different network points, the artificial neurons. Furthermore, the basic principle is based, for example, on the fact that the network should be able to learn and form new connections between the artificial neurons for this purpose.

In general, ways are being sought to mimic the functions of natural neurons and synapses, and ultimately to attempt to artificially reproduce natural neuromorphic mechanisms.

BRIEF SUMMARY

Various aspects relate to an electronic device suitably configured to artificially reproduce neuromorphic mechanisms. For example, according to various aspects, the electronic device may be configured to form polymer conductor pathways with neuromorphic properties, such as synaptogenesis and/or plasticity. Compared to conventional approaches, improved reliability and a higher level of neurological mimicry may thus be achieved.

According to various aspects, the electronic device may be configured so that the polymer conducting paths may be selectively grown between two or more than two electrodes on a substrate by applying an electrical voltage to the two or more than two electrodes. This may be done, for example, during operation of the electronic device, which may thus form part of an artificial neural network or act as an artificial neural network. The connections of this artificial neural network may, according to various aspects, be influenced (e.g., selectively adjusted) in their directionality and/or weighting, for example, by means of frequency, bandwidth, signal shape, and/or voltage level of the signal applied to the two or more than two electrodes of the electronic component. The connections of the artificial neural network may, according to various aspects, be influenced (e.g., selectively adjusted) by means of the salt concentration used in the electrolytic material configured in the electronic component.

According to various aspects, the electronic device may be configured such that repeated programming of the electronic device with different neuromorphic properties may be performed.

According to various aspects, an electronic component and a method for operating the electronic component are provided, wherein the method includes programming the electronic component. The method may be designed in such a way that reprogramming or repeated programming of the electronic component is also possible, so that the electronic component may be brought into states with neuromorphic properties that differ from one another.

According to various aspects, a directed growth of an electrical connection between two or more than two electrodes (e.g., between multiple electrodes that may act, for example, as nodes of an artificial neural network) is generated from polymer fibers using electropolymerization.

Various aspects relate to an electronic device including, for example, a substrate. The substrate may include at least two electrodes, wherein the at least two electrodes may each be spaced apart from one another on and/or within the substrate. When the electronic component is in a first operating state, for example, an electrolytic material is disposed at least in a spatial region between the at least two electrodes, the electrolytic material including at least one polymerizable material. When the electronic component is in a second operating state, for example, at least one electrical connection is made between the at least two electrodes, the at least one electrical connection including an electrically conductive polymer.

By means of a control device, for example, a corresponding electrical signal may be applied to the at least two electrodes so that the electronic component may be brought from the first operating state to the second operating state by means of the electrical signal, for example. The change from the first operating state to the second operating state is performed by means of polymerizing the at least one polymerizable material to the electrically conductive polymer.

According to various aspects, the electrically conductive polymer may include or consist of one or more fibrous structures. The one or more fiber structures may, for example, form a net shape.

By means of a control device, for example, a corresponding electrical signal may be applied to the at least two electrodes so that the electronic component may be changed from the second operating state to the first operating state or to a third operating state by means of the electrical signal, for example. The change from the second operating state to the first operating state may be performed, for example, by means of a depolymerizing and/or disentangling of the electrically conductive polymer. However, depolymerization and/or disentangling of the electrically conductive polymer may also generally be performed by means of a suitable energy supply, for example in the form of electromagnetic radiation.

According to various aspects, the polymerizable material may be a monomer of an intrinsically conductive polymer and/or a doped polymer. In this case, the electrically conductive polymer may then be the intrinsically conductive polymer and/or the doped polymer.

According to various aspects, the electronic device may further include a suitable gate structure that allows the electrical conductivity of the established electrical connection to be influenced (e.g., selectively adjusted) by means of an electric field. According to various aspects, any further electrode may act as a gate structure provided in addition to the at least two electrodes.

According to various aspects, the electronic device may have a metallization that allows the at least two electrodes or the electronic device to be connected to at least one biological nerve.

According to some aspects, an electronic component is provided, which may include, for example, a substrate, and a first electrode and a second electrode configured on and/or in the substrate at a distance from each other. Further, the electronic component includes an electrolytic material configured at least in a spatial region between the first electrode and the second electrode, the electrolytic material including or consisting of at least one polymerizable material. Further, the electronic component includes a control device for applying an electrical voltage between the first electrode and the second electrode, the control device being configured such that at least one electrical connection between at least the first electrode and the second electrode may be established by electropolymerizing the at least one polymerizable material to an electrically conductive polymer.

According to various aspects, the electronic component may further include a third electrode, wherein the control device may further be configured such that the establishment of the at least one electrical connection between at least the first electrode and the second electrode may be influenced, e.g., selectively adjusted, by means of an electrical signal provided to the third electrode.

According to various aspects, an electronic device may include a plurality of substrates, wherein the plurality of substrates may be configured on top of each other, and wherein each of the plurality of substrates may include a plurality of electrodes. For example, the plurality of electrodes of a respective substrate may be spaced apart from one another on and/or within the substrate. Further, the electronic device may include an electrolytic material that may be disposed in at least a spatial region between the plurality of electrodes of the respective substrate of the plurality of substrates. For example, the electrolytic material may include at least one polymerizable material. Further, the electronic device may include a control device for, for example, applying an electrical voltage between at least two of the plurality of electrodes of the respective substrate of the plurality of substrates. The control device may be configured, for example, to establish at least one electrical connection between the at least two electrodes of the respective substrate by electropolymerizing the at least one polymerizable material into an electrically conductive polymer.

According to various aspects, the control device may be further configured to provide an electrical voltage between at least one electrode of a first substrate of the plurality of substrates and at least one electrode of a second substrate of the plurality of substrates such that an electrical connection between the at least one electrode of the first substrate and the at least one electrode of the second substrate may be established by electropolymerizing the at least one polymerizable material into an electrically conductive polymer.

According to some aspects, an artificial neural network is provided including or formed from one or more electronic components. For example, the artificial neural network is configured such that at least one computing function may be performed by means of the one electronic component or by means of the plurality of electronic components.

According to various aspects, there is provided a method of operating an electronic device, the method including, for example: providing an electrolytic material at least in a spatial region between at least two electrodes, wherein the at least two electrodes are each spaced apart on and/or in the substrate, and wherein the electrolytic material includes at least one polymerizable material.

The method may further include, for example: Forming at least one electrical connection between the at least two electrodes by polymerizing the at least one polymerizable material into an electrically conductive polymer.

It is understood that a method described herein (e.g., a method of operating an electronic device) may correspondingly include one or more method steps described herein with reference to functions of a device (e.g., with reference to the electronic device), and vice versa.

Examples of aspects are shown in the figures and are explained in more detail below.

BRIEF DESCRIPTION OF THE DRAWINGS

Various exemplary aspects of the disclosure are described with reference to the following drawings, in which.

Figure 1A:
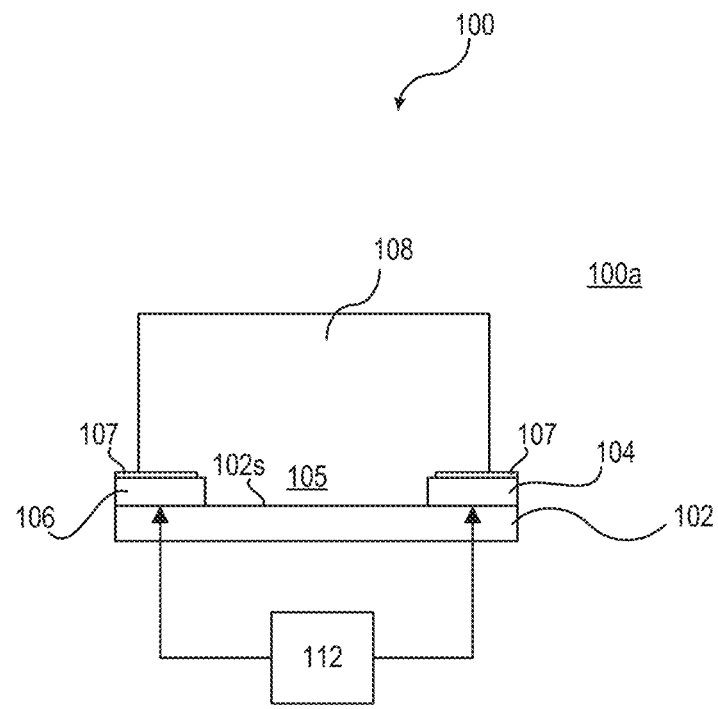
FIG. 1A shows an electronic component in a schematic view, according to various aspects.

In the following detailed description, reference is made to the accompanying drawings, in which specific details and aspects in which the invention may be practiced are shown for illustrative purposes. It is understood that other aspects may be used and structural or logical changes may be made without departing from the scope of protection of the present invention. It is understood that the features of the various exemplary aspects described herein may be combined, unless specifically indicated otherwise. Therefore, the following description is not to be construed in a limiting sense, and the scope of protection of the present invention is defined by the appended claims.

DETAILED DESCRIPTION

According to various aspects, an electronic device may include a substrate. For example, the substrate may have a planar surface and may serve, for example, as a support for electrodes or the like. The substrate may be, for example, mechanically rigid, e.g., rigid, inflexible, or solid, or the substrate may be mechanically flexible, e.g., bendable, elastic, or movable. For example, a structure that is not physically connected to the electrodes of the electronic device described herein cannot be understood as a substrate.

As used herein, the term "electrical connection" may describe, for example, a structure embodied by an electrically conductive polymer. For example, the electrically conductive polymer extends between at least two electrodes and may be in physical contact with the at least two electrodes. According to various aspects, an electrolyte (e.g., in the form of an electrolyte solution or a solid-state electrolyte) may be provided between the at least two electrodes, wherein even if the electrolyte is electrically conductive to some extent, it is not understood to be an electrical connection.

The term "electrical connection" as used herein may describe, for example, a structure that provides electrical conductivity based on electron or hole conduction. For example, an electrolyte may be understood as an ionic conductor.

As used herein, the term "operating state" may be understood to mean, for example, a state of a functioning electronic device. The operating state may be, for example, an idle state (off state, characterized, for example, by a lack of conductivity of the polymeric compound or by the absence of the polymeric compound) and an active state (on state, characterized, for example, by an electrical conductivity of the polymeric compound and the presence of the polymeric compound), but may also extend beyond these states regardless of whether the electronic component is supplied with electrical energy. Illustratively, the operating state of the electronic component may be maintained for at least a period of time (e.g., days, weeks, or months), for example, even without the supply of electrical energy. For example, a first operating state may be a state of the electronic component in which no electrical connection is provided by means of the electrically conductive polymer between the at least two electrodes. In this regard, a region between the at least two electrodes may be substantially free of electrically conductive polymer. The first operating state may be understood illustratively as, for example, a non-programmed or untrained state of the electronic device. A second operating state of the electronic device may be, for example, a state of the electronic device in which the electrical connection between the at least two electrodes is established by means of the electrically conductive polymer. In this regard, the electrically conductive polymer may be physically and electrically connected to the at least two electrodes. The second operating state may be understood descriptively as, for example, a programmed or trained state of the electronic device. According to various aspects, the electronic device may be placed in one of a plurality of second states.

According to various aspects, the electronic device may be brought into a state by means of the gate structure that cannot be maintained without applying energy. For example, by applying an electrical signal to the gate structure, the polymer junction between the at least two electrodes may be modulated in its electrical conductivity (e.g., between low and high conductivity).

The term "plasticity" as used herein may be understood, for example, as a property (for example, electrical conductivity) of the electrical connection of the electronic component. This may be changed and adapted by stimulation, for example by means of an electrical signal, in accordance with the stimulation. The plasticity may thus be understood as a basic requirement for programming the electronic component.

According to various aspects, stimulation may be performed using an electrical signal such that the physical properties of the electrical connection between the at least two electrodes change, for example, by becoming more branched, thicker, and/or more grown. Thus, the electrical properties of the electrical connection may change. For example, the electrical conductivity of the electrical connection may increase due to electrical stimulation.

According to various aspects, a change in the electrical properties of the electrical connection may also be possible absent stimulation, for example by means of an absent electrical signal, whereby the electrical connection may, for example, degrade. This may occur, for example, due to degradation and/or disentangling or removal of the electrically conductive polymer including the electrical connection. Thus, for example, the electrical properties of the electrical connection may also change over time. For example, the electrical conductivity of the electrical connection may reduce over time.

The term "short-term plasticity" as used herein may be understood to include the order of magnitude of the time in which plasticity may change itself or be changed by means of stimulation. The same applies to the term "long-term plasticity" as used herein. According to various aspects, the magnitude of time associated with short-term plasticity may be less than the magnitude of time associated with long-term plasticity. For example, the time associated with the short term plasticity may be less than 1 h, e.g., less than 1 min, e.g., less than 1 s. The time associated with long-term plasticity may be, for example, greater than 1 h, e.g., greater than 10 h, e.g., greater than 24 h.

Figure 1B:
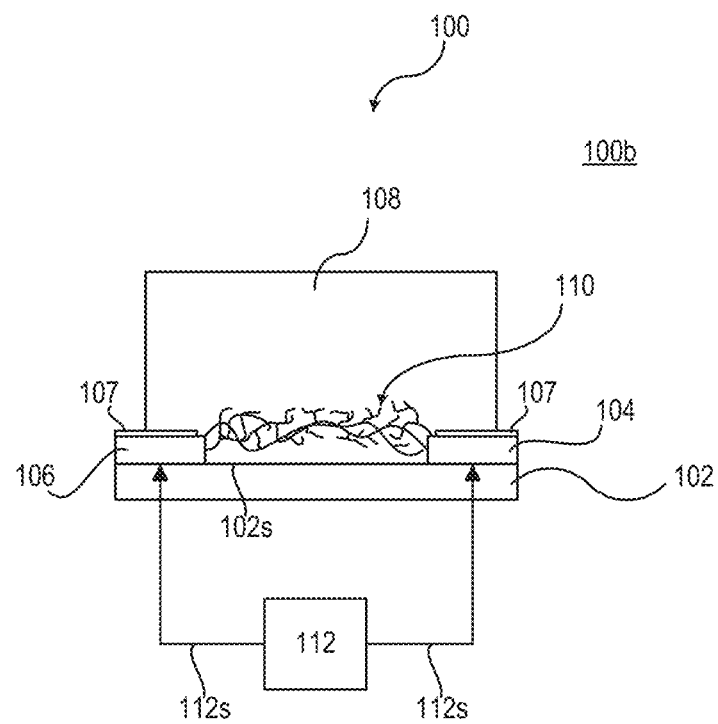
FIG. 1B shows a further view of the electronic component in a schematic view, according to various aspects.

FIG. 1A and FIG. 1B illustrate an electronic component 100 in two mutually different operating states 100a, 100b in a schematic view, according to various aspects.

According to various aspects, the electronic component 100 may include a substrate 102. For example, the electronic component 100 or the substrate 102 of the electronic component 100 may include at least two electrodes 104, 106. The at least two electrodes 104, 106 are each spaced apart from each other on and/or within the substrate 102. The substrate 102 may be, for example, a non-conductive substrate 102. The substrate 102 may, for example, include an electrically semiconductive or electrically conductive portion, which may then be electrically isolated from the at least two electrodes 104, 106 by means of at least one electrically insulating layer.

According to various aspects, a conductive substrate (e.g., a substrate having ionic conductivity) may assume or partially assume the role of the electrolytic material. Further, for example, electrical insulation (e.g., a layer of electrically insulating material) may optionally be provided between the conductive substrate and the electrolytic material.

When the electronic device 100 is in a first operating state 100a, see for example FIG. 1A, an electrolytic material 108 may be disposed in at least a spatial region between the at least two electrodes 104, 106. The electrolytic material 108 may include at least one polymerizable material. According to various aspects, the electrolytic material 108 may include an electrolyte solution, and the polymerizable material may be dissolved and/or dispersed in the electrolyte solution. According to various aspects, the electrolytic material 108 may include a carrier liquid, wherein the electrolyte may be dissolved and/or dispersed in the carrier liquid, and wherein the polymerizable material may also be dissolved and/or dispersed in the carrier liquid.

When the electronic device 100 is in a second operational state, see for example FIG. 1B, at least one electrical connection 110 may be established between the at least two electrodes 104, 106. The at least one electrical connection 110 may include or be formed from, for example, an electrically conductive polymer. The electrically conductive polymer may be or may be formed by polymerizing the polymerizable material.

The electronic device 100 may thus exhibit neuromorphic properties, according to various aspects. Neuromorphic properties may be based, for example, on the formation of the electrical connection 110 between the electrodes 104, 106 (analogous to neuronal synaptogenesis), as well as on a plasticity of the at least one electrical connection 110 that may be changed by means of an electrical signal applied to the electrodes 104, 106 of the electronic component 100 (illustratively analogous to neuronal plasticity). The electronic component 100 may thus be or become designed, for example, as a neuromorphic chip and/or synaptic connection in so-called brain-computer interfaces (Brain-Computer-Interface).

According to various aspects, each of the at least two electrodes 104, 106 may be electrically insulated in sections from the electrolytic material 108. For example, one or more portions of the respective electrode 104, 106 may be electrically isolated from the electrolytic material 108 by means of an electrically insulating layer 107. For example, the electrically insulating layer 107 may be or may be applied to the respective region of the electrode 104, 106 that is to be electrically insulated from the electrolytic material 108. Thus, for example, at least one active portion of the respective electrode 104, 106 may be defined from which the formation of the electrical connection 110 starts or towards which the electrical connection 110 may grow.

In the following, some detailed aspects are described with reference to the electronic component 100. It is understood that these detailed aspects concern only exemplary aspects and that the electronic component 100 may also be designed in other suitable ways.

For example, the substrate 102 may include or be formed from a steel foil, steel sheet, a plastic wafer, a plastic film, or a laminate including one or more plastic films. The plastic may include or be formed from one or more polyolefins (for example, high or low density polyethylene (PE) or polypropylene (PP)). Further, the plastic may include or be formed from polyvinyl chloride (PVC), polystyrene (PS), polyester and/or polycarbonate (PC), polyethylene terephthalate (PET), polyethersulfone (PES), polyetheretherketone (PEEK), polytetrafluoroethylene (PTFE), and/or polyethylene naphthalate (PEN). The substrate 102 may include one or more of the above materials.

The substrate may, according to various aspects, include or consist of natural polymers, e.g., cellulose, collagen, polylactic acid, gelatin. These natural polymers or other materials may act, for example, as ion-conducting materials.

According to various aspects, the electrolytic material may be provided by a material of the substrate.

At least a first electrode 104 and a second electrode 106 may be formed on and/or in the substrate 102. For example, the at least two electrodes 104, 106 may be disposed in substantially the same plane on and/or within the substrate 102. In some aspects, the substrate 102 may have a substantially planar surface 102s, and the at least two electrodes 104, 106 may be or may be directly deposited on the planar surface 102s. Alternatively, the at least two electrodes 104, 106 may be disposed in different planes on and/or within the substrate 102.

According to various aspects, the at least two electrodes 104, 106 may be spaced less than 200 µm apart, e.g., less than 150 µm, less than 100 µm, less than 50 µm, less than 20 µm, or less than 5 µm.

According to various aspects, a plurality of the electrodes (e.g., more than 25 or more than 100 electrodes) may be provided such that the electrodes are configured in the form of a grid. For example, the grid may be 2-dimensional or 3-dimensional. The respective adjacent electrodes may be substantially the same distance apart. Illustratively, the grid may be, for example, a square or cubic grid. According to various aspects, growth of the electrically conductive polymer compounds may occur within a structure that is 3-dimensionally porous.

For example, the at least two electrodes 104, 106 may include or consist of a metal or metal alloy. For example, the at least two electrodes 104, 106 may include or consist of aluminum, copper, gold, platinum, silver. Also, for example, the at least two electrodes 104, 106 may include or consist of silver chloride, platinum, iridium, palladium, nickel, molybdenum, tantalum, tungsten, etc. Also, the at least two electrodes 104, 106 may include or consist of carbon or a highly conductive polymer (e.g., PEDOT:PSS).

According to various aspects, the electrolytic material 108 may include or consist of a liquid electrolyte, for example, an ionic liquid, a carbonate-based electrolyte, and/or a polymer electrolyte, also known as an ionomer. Alternatively or additionally, the electrolytic material 108 may include or consist of porous media immersed in a solution, for example, an ionic porous polymer and/or a porous electrolyte solid.

Furthermore, the electrolytic material has 108 mobile ions. The ions may be, for example, perchlorate ions or other suitable ions. In this regard, the electrolytic material 108 may include lithium perchlorate, tetrabutylammonium perchlorate, or other suitable materials, such as sodium chloride, sodium bromide, potassium chloride, copper(II) chloride, copper sulfate, sodium iodide, and so forth.

For example, the electrolytic material 108 may be disposed in a spatial region 105 between the at least two electrodes 104, 106. In this regard, the at least two electrodes 104, 106 may be at least partially in physical contact with the electrolytic material 108.

According to various aspects, the electrolytic material 108 may include a polymerizable polymer. In this regard, the polymerizable material may be a monomer of an intrinsically electrically conductive polymer. For example, the monomer may be polymerized to form an electrically conductive polymer. For example, the monomer may include or be 3,4-ethyleneedioxythiophene. The intrinsically conductive polymer in this case may have or be poly(3,4-ethylenedioxythiophene).

Alternatively or additionally, the polymerizable material may be a monomer of a doped polymer. In this case, the monomer may be converted to a doped polymer by polymerization.

As illustrated in FIG. 1A and FIG. 1B, the electronic device 100 may include a control device 112, or the at least two electrodes 104, 106 of the electronic device 100 may be coupled to a control device 112 for providing an electrical signal to the at least two electrodes 104, 106.

According to various aspects, the control device 112 may be configured to move the electronic component 100 from the first operating state 100a to the second operating state 100b by means of the provided electrical signal 112s. This may be done by means of polymerizing the at least one polymerizable material to form the electrically conductive polymer. In this regard, the provided electrical signal 112s may have an amplitude in a range from about 20 mV to about 5 V, for example, in a range from about 50 mV to about 2 V.

According to various aspects, the provided electrical signal 112s may have a time-varying electrical voltage, such as an AC voltage, a pulsed DC voltage, and/or a pulsed bipolar voltage.

For example, the control device may be configured such that the provided electrical signal 112s results in directional fiber growth of the at least one polymerizable material. In this regard, the growth may occur from the first electrode 104 toward the second electrode 106. Further, the electrical signal 112s may be provided such, for example, alternately on the first electrode 104 and the second electrode or 106 with alternating polarity such that growth occurs from the first electrode 104 toward the second electrode 106 and also from the second electrode 106 toward the first electrode 104. For example, polymerizing the at least one polymerizable material may occur such that the electrically conductive polymer is formed alternately on the first electrode 104 and the second electrode 106, for example as one or more fibrous structures on the first electrode 104 and one or more fibrous structures on the second electrode 106, until the one or more fibrous structures formed on the first electrode 104 combine with the one or more fibrous structures formed on the second electrode 106 to form the electrically conductive polymer compound.

Directional growth of the at least one polymerizable material, e.g., alternately on the first electrode 104 and the second electrode 106, may cause, for example, the electrically conductive polymer to have a signal-dependent fibrous structure. This may, for example, have the advantage that the electrically conductive polymer compound may be adjusted in many steps (e.g., with more than three different values), for example, with respect to electrical conductivity, by suitable selection of the electrical signal. For example, thereby the electronic component 100 may have not only an on operating state and an off operating state, but at least one further, operating state between the on operating state and the off operating state, for example 20, for example 100, for example 1000, for example 5000 different operating states. In this regard, the electronic component 100 may act as a memory cell, for example.

For example, the fibrous structure of the electrically conductive polymer may differ from a film-like structure in that the fibrous structure may include, for example, one or more longitudinal portions that may be fully surrounded by the electrolytic material 108. For example, one or more longitudinal portions of the fibrous structure may be fully free of physical contact with the substrate 102.

For example, the control device 112 may be configured such that the time-varying electrical voltage has a frequency in a range from about 10 Hz to about 10 kHz, e.g., in a range from about 5 Hz to about 5 kHz, e.g., in a range from about 2 Hz to about 2 KHz. According to various aspects, the control device 112 may be configured such that the time-varying electrical voltage is a periodic electrical voltage having a period in a range from about 0.01 ms to about 0.1 s, e.g., in a range from about 0.5 ms to about 50 ms.

For example, the control device 112 may be configured such that the time-varying electrical voltage has a duty cycle (also referred to as an on-time) in a range from about 10% to about 50%, for example, in a range from about 20% to about 40%.

For example, the control device 112 may be configured such that the time-varying electrical voltage has a bandwidth in a range from about 10 Hz to about 10 kHz, for example in a range from about 5 Hz to about 5 kHz, in a range from about 2 Hz to about 2 kHz.

According to various aspects, polymerization of the at least one polymerizable material may only occur when the applied electrical voltage is above a threshold electrical voltage. Thus, the monomers may oxidize, for example, and the radical cations necessary or helpful for the chemical reaction may be formed. The threshold electrical voltage may depend on the configuration of the at least two electrodes 104, 106. For example, the electrical threshold voltage may be a function of the distance present between the electrodes 104, 106, and/or a function of the characteristics of the electrical signal provided, such as a function of pulse frequency. As an example, if the electrodes are spaced 200 microns apart and the pulse frequency is in a range of about 10 Hz to about 10 kHz, the threshold electrical voltage may be in a range of about 20 mV to about 5 V.

As illustrated in FIG. 1A, the electrolytic material 108 may be substantially free of the electrically conductive polymer electrical connection 110 in the first operating condition 100a. For example, the electronic device 100 may be free of a continuous polymer structure that electrically conductively and physically connects the first electrode 104 to the second electrode 106. Illustratively, the first operating state 100a of the electronic component 100 may be a reprogrammed state of the electronic component 100. In this regard, the polymerizable material in the electrolytic material 108 may be substantially in the form of monomers. The electrolytic material 108 may also include polymers of the polymerizable material, wherein the polymers may be present in the electrolytic material 108 in soluble and/or insoluble form, but do not bind the at least two electrodes 104, 106 together.

As exemplified in FIG. 1B, the electronic component 100 may include at least one electrical connection 110 in the second operating state 100b. For example, the electronic component 100 may include a structure that electrically and physically connects the first electrode 104 to the second electrode 106. Illustratively, the second operating state of the electronic component 100 may be a programmed state of the electronic component 100. In this regard, the electrolytic material 108 includes the electrically conductive polymer that may form the electrical connection 110. The electrical connection 110 is at least partially insoluble in the electrolytic material 108 and is substantially surrounded by the electrolytic material 108, for example. The electrical connection 110 may be or may be formed by means of electropolymerization, for example, by means of field-directed polymerization of the at least one polymerizable material of the electrolytic material 108 to the electrically conductive polymer. Also, in the second operating condition, the electrolytic material 108 may further include the polymerizable material and polymers of the polymerizable material that are different from the electrically conductive polymer, wherein the different polymers may be included in the electrolytic material 108 in soluble and/or insoluble form. Illustratively, the at least one electrical connection 110 may be or may be formed from a portion of the total amount of polymerizable material.

According to various aspects, the electrically conductive polymer may include or consist of one or more fiber structures. In this regard, the one or more fiber structures may be, for example, net-shaped or at least single or multiple branched. For example, the one fiber structure may include one strand or a plurality of strands, the one strand or the plurality of strands extending from the first electrode 104 to the second electrode 106.

The physical properties (e.g., electrical conductivity) of the at least one compound 110 may be defined by, for example, the length and/or thickness of the one or more fiber structures of the at least one electrical connection 110, the number of fiber structures, the degree of branching of the one or more fiber structures, and/or the directionality of the one or more fiber structures. The term "directionality" is understood to mean the direction in which the one or more fiber structures extend in the electrolytic material 108 and whether the one or more fiber structures grow substantially from one of the at least two electrodes 104, 106 or whether the one or more fiber structures grow from both of the at least two electrodes 104, 106.

In this regard, the control device 112 may be configured to provide an electrical voltage between the at least two electrodes 104, 106 such that the electrical voltage is used to form the electrically conductive polymer of the at least one electrical connection 110 from the at least one polymerizable material of the electrolytic material 108. Illustratively, polymerizing the at least one polymerizable material of the electrolytic material 108 may be performed such that the electronic device 100 is brought into the second operating state 100b. According to various aspects, the electrical voltage may be applied using the control device 112 such that at least one electrical connection 110 electrically and physically connects the first electrode 104 to the second electrode 106.

Further, the electrical signal 112s provided by the control device 112 may affect the physical and electrical characteristics of the at least one electrical connection 110, as discussed in more detail, for example, in FIG. 2 through FIG. 9.

According to various aspects, the electrically conductive polymer may be at least partially free of physical contact with the substrate 102. For example, the at least one electrical connection 110 may be fully surrounded by electrolytic material 108.

According to various aspects, the electrolytic material 108 may include mobile ions for providing short-term plasticity to the at least one electrical connection 110. In this regard, the mobile ions may, for example, penetrate the electrically conductive polymer such that the electrical connection 110 is doped. Alternatively, the ions may, for example, attach to the electrically conductive polymer such that the electrical connection 110 is affected. This enables, for example, a change in the physical and/or electrical properties of the at least one electrical connection 110.

Figure 2:
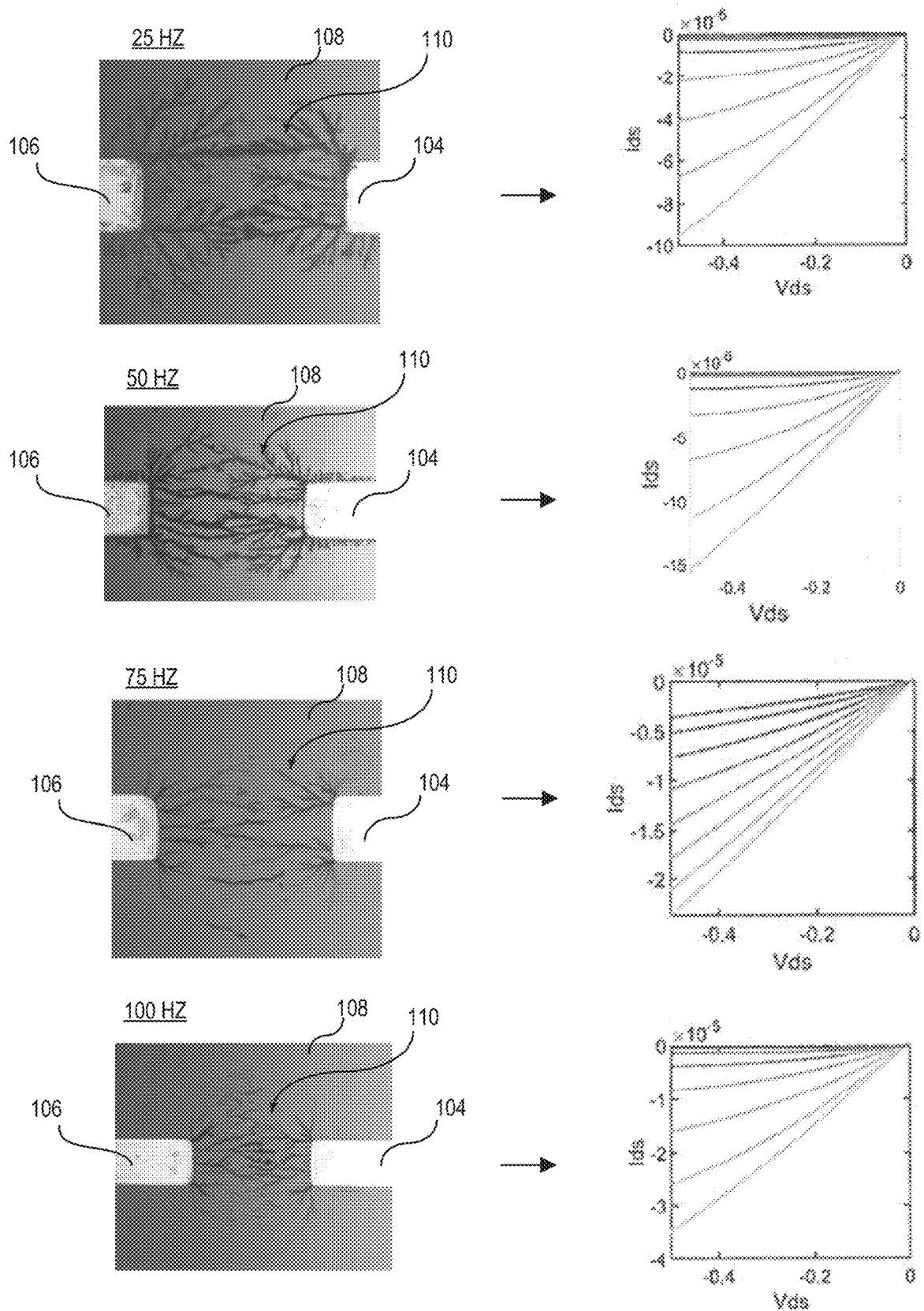
FIG. 2 shows several comparative figures during the formation of an electrical connection between electrodes depending on the frequency of the electrical signal applied to the electrodes, according to various aspects.

FIG. 2 illustrates a plurality of comparison figures (left) relating to forming the at least one electrical connection 110 of an electronic device 100 depending on a frequency of the electrical signal 112s. Further, a plurality of graphs (right) are associated with the comparison illustrations depicting the conductivity of the at least one electrical connection 110.

For example, the higher the frequency of the electrical signal 112s provided by the control device 112, the higher the number of formed fiber structures may be and, consequently, the higher the conductivity of the at least one electrical connection 110 may be. For example, it has been recognized that higher frequencies promote branching of the one or more fiber structures, which may result in a higher number of strands physically and electrically connecting the first electrode 104 to the second electrode 106. This realizes, for example, a synaptogenesis-like process that occurs continuously in a brain in which new connections are created, synaptic pathways are strengthened, and memories are encoded.

A higher frequency of the electrical signal 112s provided by the control device 112 may illustratively correspond to more intensive training of the electronic device 100 when used as a node or a network. This allows, for example, mimicking biological mechanisms (such as learning-induced synaptogenesis, reconnection, and conditioning) and realizing a new approach to neuromorphic computing, neural contacts or interfaces, and physical neural networks.

Figure 3A:
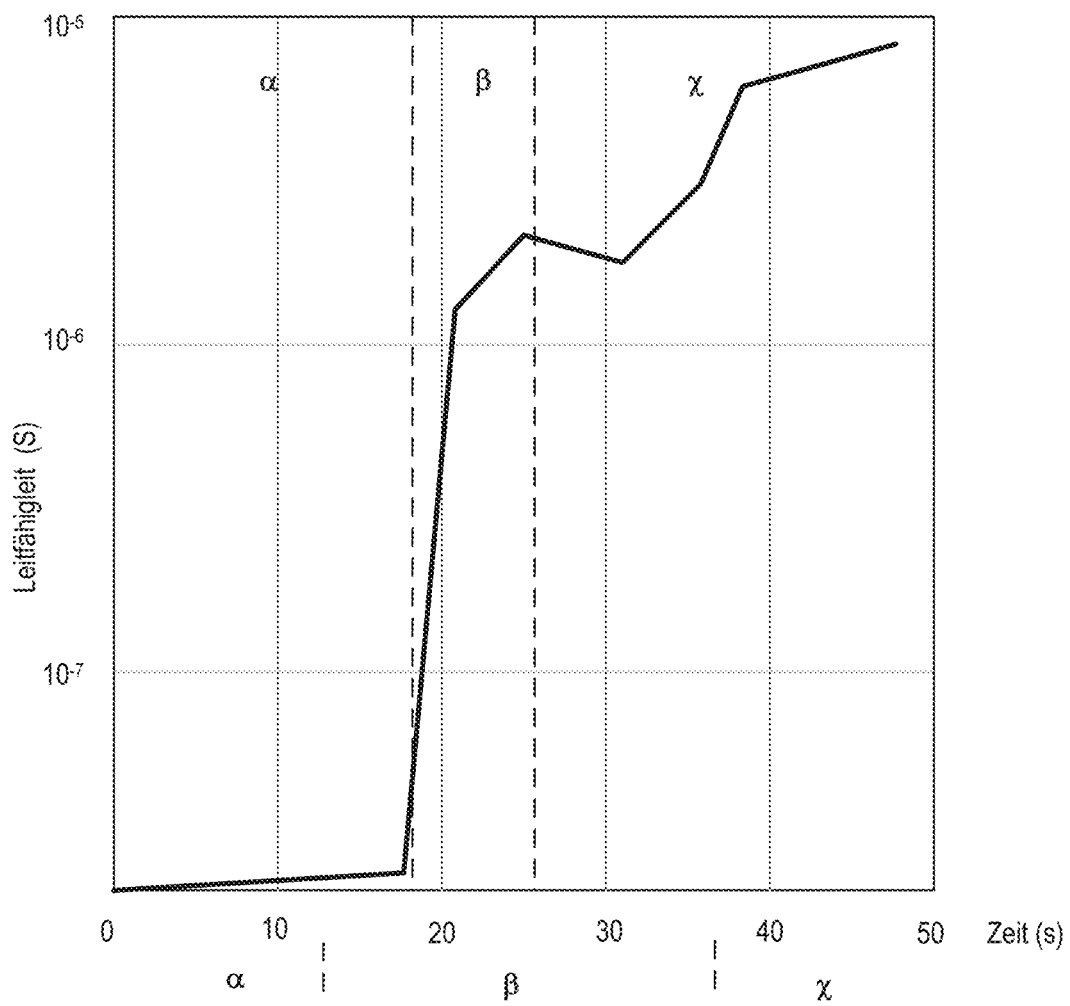
FIG. 3A shows a graph of a conductivity of an electrical connection as a function of the time duration of an application of an electrical signal to form the electrical connection, and associated schematic illustrations of corresponding states of the electrical connection, according to various aspects.
Figure 3B:
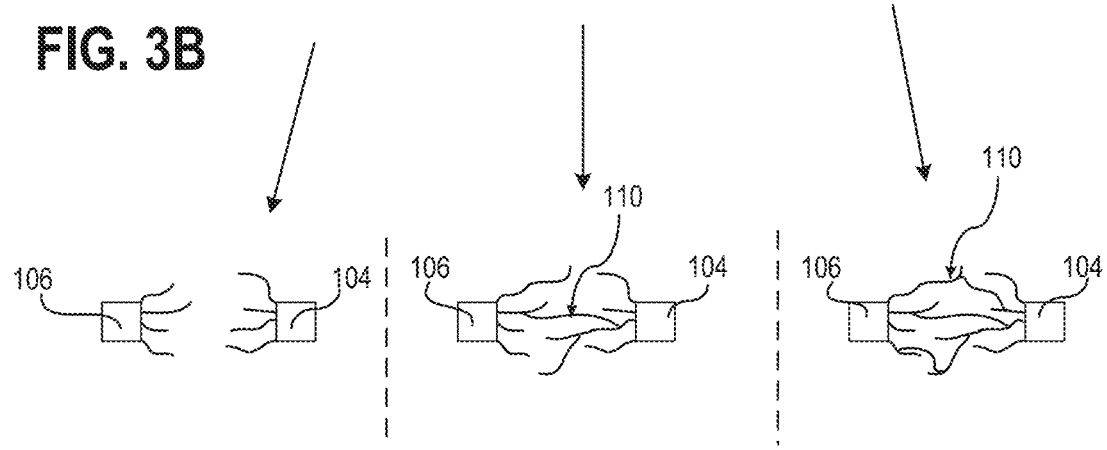
FIG. 3B shows further view of a graph of a conductivity of an electrical connection as a function of the time duration of an application of an electrical signal to form the electrical connection, and associated schematic illustrations of corresponding states of the electrical connection, according to various aspects.

FIG. 3A and FIG. 3B illustrate a change in electrical conductivity of the at least one electrical connection 110 of the electronic device 100 depending on the time period of application of the electrical signal 112s at 200 Hz, as well as schematic illustrations of the corresponding states of the at least one electrical connection 110, according to various aspects.

For example, as illustrated in FIG. 3A, a low electrical conductivity may be measured for the at least one electrical connection 110 forming a plateau during a first time period (region α), e.g., the first eighteen seconds, of application of the electrical signal 112s. The low conductivity measured in this process may be for the most part the conductivity of the electrolytic material 108.

In the first time period, although one or more fiber structures of electrically conductive polymer may grow as shown in the accompanying schematic illustration in FIG. 3B, the first electrode 104 and the second electrode 106 are not yet electrically conductive and physically connected by means of the at least one electrical connection 110. In this regard, the electronic component 100 is still in the first operating state 100a. The plateau in the region α thus illustratively reflects the learning mechanism of the neurons, as well as a certain learning time.

According to various aspects, the electrical conductivity of the electrolytic material 108 may be less than the electrical conductivity of the at least one electrical connection 110. For example, the electrical conductivity of the at least one electrical connection 110 is greater than 10, 50, or 100 times the electrical conductivity of the electrolytic material 108, and the electrical conductivity of the at least one electrical connection 110 may be greater than $10^6$ S/m.

For example, as illustrated in FIG. 3A, an increasing electrical conductivity for the at least one electrical connection 110 may be measured during a second time period (region β), e.g., when the electrical signal 112s is applied for longer than eighteen seconds. This may be accompanied by the formation of the at least one electrical connection 110, forming a continuous strand of the one or more fiber structures. Thus, the electrical connection 110 electrically and physically connects the first electrode 104 to the second electrode 106, see the accompanying figure in FIG. 3B. For example, the electronic component 100 may be in the second operating state 100b during the second time period, and after the second time period, the electronic component 100 may be in the second operating state 100b.

For example, as illustrated in FIG. 3A, in a third time interval (region x), e.g., when the electrical signal 112s is applied for longer than 25 s or after at least one electrically conductive path (strand) of the polymer material has been formed between the two electrodes, the electrical signal 112s may continue to be applied or may be applied again. In this case, the electrical conductivity of the at least one electrical connection 110 may continue to change. For example, the one or more fiber structures may continue to grow, forming, for example, strands of one or more fiber structures that electrically and physically connect the first electrode 104 to the second electrode 106, see the accompanying figure in FIG. 3B. Thus, the electronic device 100 may be programmed in a different manner in an illustrative manner.

Figure 4A:
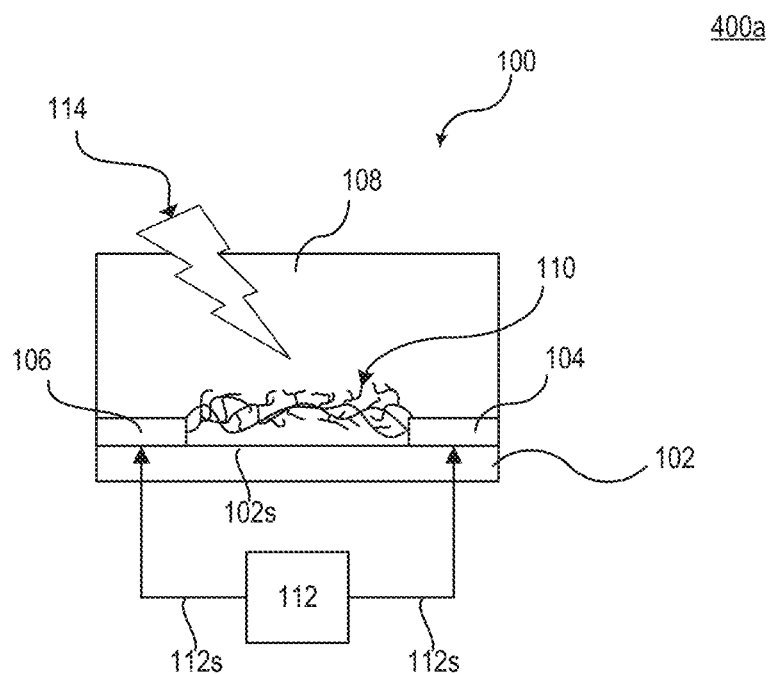
FIG. 4A shows an electronic component in a schematic view, according to various aspects.
Figure 4B:
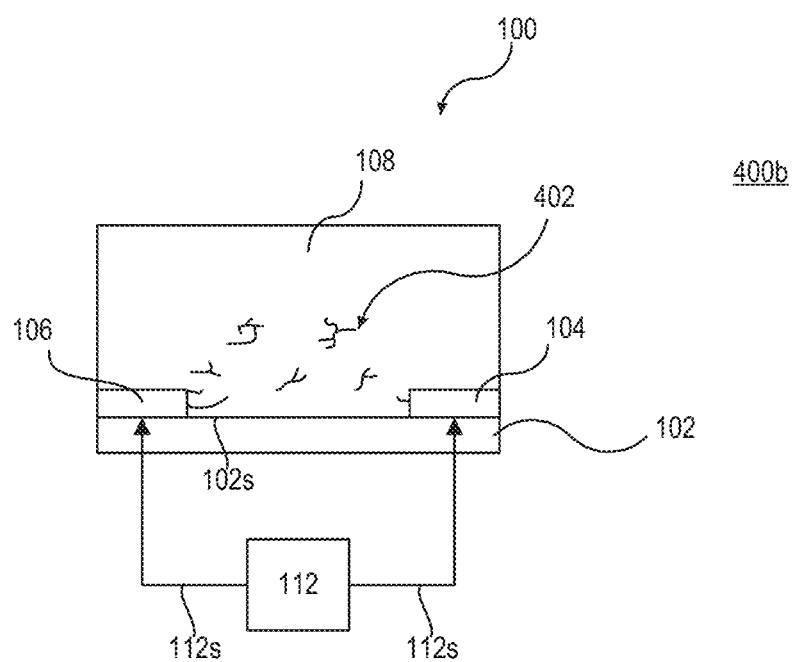
FIG. 4B shows a further view of an electronic component in a schematic view, according to various aspects.

FIG. 4A and FIG. 4B illustrate an electronic component 100 in a schematic view, according to various aspects.

According to various aspects, the electronic component 100 may be brought from the second operating state (see, for example, FIG. 4A) to the first operating state or to a third operating state (see, for example, FIG. 4B). Illustratively, the electronic component 100 may be returned from a programmed state to a non-programmed state or may be placed in a different state.

According to various aspects, the electrical connection 110 of the electronic device 100 may be at least partially degraded, for example, such that at least the first electrode 104 is no longer electrically and physically connected to the second electrode 106 by means of the electrically conductive polymer forming the electrical connection 110.

According to various aspects, the control device 112 may be configured, for example, such that the electronic component 100 may be brought from the second operating state 100b to the first operating state 100a by means of the provided electrical signal 112s. In this regard, the provided electrical signal 112s may have a time-varying electrical voltage that at least partially degrades the electrical connection 110 of the electronic component 100, for example, such that at least the first electrode 104 is no longer electrically and physically connected to the second electrode 106.

Alternatively, or in addition thereto, the electrolytic material 108 may be configured, for example, such that the electronic component 100 may be brought from the second operating state 100b to the first operating state 100a or other further state by means of the provided electrical signal 112s of the control device 112. In this case, the electrolytic material 108 may include, for example, a material, such as an enzyme and/or a chemical compound, suitable for at least partially degrading the electrical connection 110 by means of the provided electrical signal of the control device 112.

Alternatively, or in addition thereto, the electronic component 100 may further be configured such that the electronic component 100 may be brought from the second operating state 100b to the first operating state 100a or other further state by means of an additional device. For example, the additional device may be a device that may at least partially remove the electrical connection 110 by means of energy supply 114. For example, the energy supply 114 may be by means of supplying thermal energy. Alternatively or additionally, the energy delivery 114 may be by means of delivering electromagnetic radiation. In this regard, the supplying of thermal energy and/or electromagnetic radiation may be performed by means of heating and/or by means of irradiating the at least one electrical connection 110 and/or the electrolytic material 108.

According to various aspects, the electrolytic material 108 may be configured such that depolymerization, degradation, and/or disentanglement or dissolution of the electrically conductive polymer may occur by means of the energy supply 114. Alternatively, or in addition thereto, the electronic device 100 may be configured, for example, such that depolymerization and/or disentangling of the electrically conductive polymer may occur by means of the energy supply 114. Alternatively or additionally, the electronic component 100 may be configured, for example, such that degradation of the electrically conductive polymer may occur by means of the energy supply 114.

Degradation of the electrically conductive polymer may, for example, exhibit a reduction in the doping of a doped electrically conductive polymer.

As illustrated in FIG. 4B, the electrical connection 110 of the electronic device 100 may be degraded such that the electrolytic material 108 includes fragments 402, such as polymer fragments and/or monomers from the electrically conductive polymer of the at least one electrical connection 110. In this regard, the electrolytic material 108 may include other monomers that were present in the electrolytic material 108 prior to converting the electronic component 100 from the first operating state 100a to the second operating state 100b. For example, the electrolytic material 108 may have monomers that have not yet been reacted or undergone polymerization. For example, the fragments 402 may be unreactive to re-polymerization. Alternatively, the fragments 402 may be or form newly polymerizable materials. By means of the polymerizable materials, for example polymer fragments and/or monomers, present in the electrolytic material 108, the electronic device 100 may be re-polymerized from, for example, the newly acquired first operating state 100a to a new second operating state 100b.

The electronic device 100 may be moved from the first operating state to the second operating state and back to the first operating state multiple times, as long as the electrolytic material 108 includes polymerizable material such that an electrical connection 110 may be formed between the first electrode 104 and the second electrode 106. Illustratively, according to various aspects, the electronic component 100 allows for multiple programming's. Thus, for example, the electronic component 100 may have different physical and electrical properties as a result of the new programming.

Figure 5:
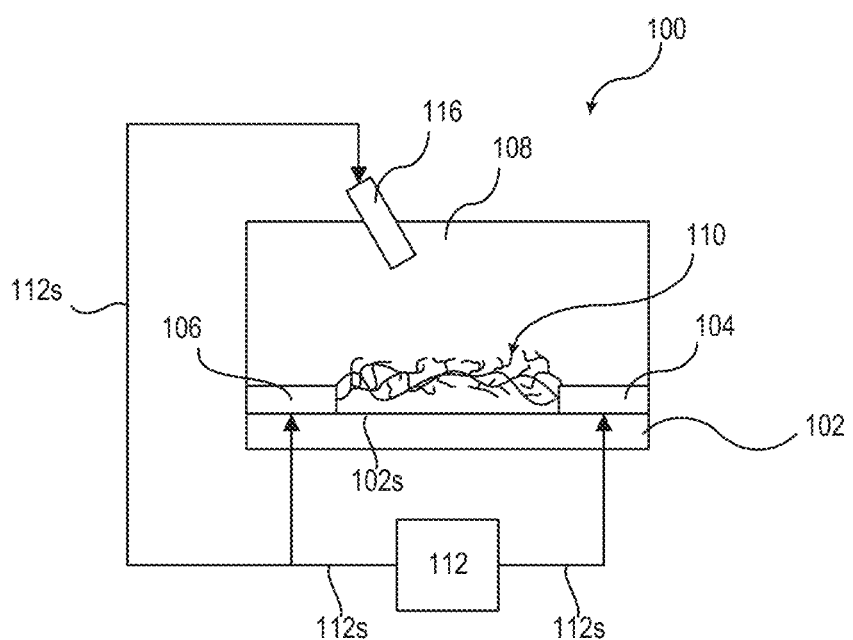
FIG. 5 shows an electronic component in a schematic view, according to various aspects.

FIG. 5 shows an electronic component 100 in a schematic view, according to various aspects.

According to various aspects, the electronic component 100 may include a further (for example, a third) electrode 116. This may be used as a gate structure 116 for influencing the electrical conductivity of the fabricated electrical connection 110 by means of an electric field. Alternatively or additionally, the further electrode may be effectively used for influencing polymer growth, for example for influencing physical properties of the at least one electrical connection 110. Physical properties that may be influenced, for example, include, but are not limited to, the length and/or thickness of the one or more fibers or strands of the fiber structures of the at least one electrical connection 110, the number of fibers or strands of the fiber structures or the number of fiber structures, the degree of branching of the one or more fiber structures, and/or the directionality of the one or more fiber structures.

In this regard, the gate structure 116 may be disposed adjacent to the at least two electrodes 104, 106, for example at a distance from at least one of the two electrodes 104, 106, for example at a distance of 100 µm to 500 µm. Further, the gate structure is in contact with the electrolytic material 108, for example.

For example, the control device 112 of the electronic component 100 may be configured to provide an electrical voltage to the gate structure 116 such that the electrical conductivity of the at least one electrical connection 110 may be changed by means of the electrical voltage.

The gate structure 116 may include a liquid electrolyte, a polymer electrolyte, a metal contact, and/or a contact made of an electrically conductive organic material.

According to various aspects, the electrical potential of the gate structure 116 may be selected to influence and/or control the formation of the at least one electrical connection 110, for example, between the first electrode 104 and the second electrode 106.

According to various aspects, the learning process of the electronic device 100 may be triggered and/or influenced by means of a plurality of electrodes, for example by means of at least three electrodes.

For example, an electrical voltage below a threshold electrical voltage may be or may be applied between the first electrode 104 and the second electrode 106, in which case no electrical connection 110 is formed. Nevertheless, in this case, by means of the gate structure 116, for example when the gate structure 116 is set to a predefined voltage (e.g., a bias voltage), polymerization of the polymer material may be initiated between the first electrode 104 and the second electrode 106. Illustratively, the gate structure 116 may operate in concert with the at least two electrodes 104, 106 and act accordingly on the two electrodes 104, 106. The underlying effect of the initiated polymerization may be present, for example, due to an increased doping concentration at one of the two electrodes 104, 106, such as when the gate structure 116 is negatively charged and attracts the positive ions of the electrolytic material 108.

Figure 6:
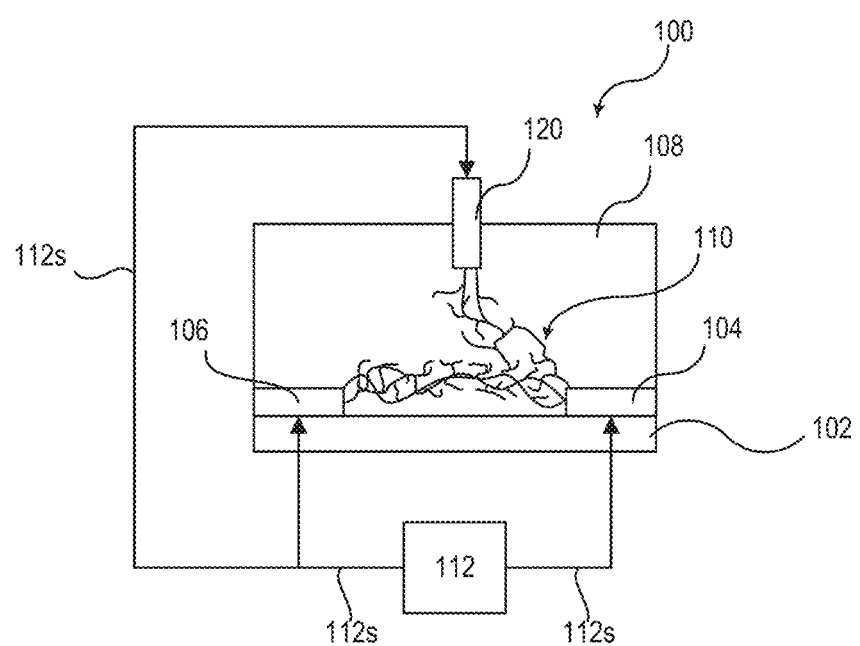
FIG. 6 shows an electronic component in a schematic view, according to various aspects.

FIG. 6 shows an electronic component 100 in a schematic view, according to various aspects.

According to various aspects, the electronic device 100 may further include at least one further electrode 120 in addition to the first electrode 104 and the second electrode 106. For example, the control device 112 may be further configured to influence the formation of the at least one electrical connection 110 between at least the first electrode 104 and the second electrode 106 by means of a further electrical signal provided to the respective further electrode 120.

For example, the electrical conductivity of the electrical connection 110 may be modified by means of an electrical signal provided to the at least one further electrode 120 such that the electrical connection 110 includes one or more further fiber structures. For example, the one or more further fiber structures may physically and electrically connect the first electrode 104 to the at least one further electrode 120, as illustrated in FIG. 6. The one or more further fiber structures may, for example, physically and electrically connect the second electrode 106 to the at least one further electrode 120 (not illustrated in FIG. 6). For example, the one or more further fiber structures may physically and electrically connect the first electrode 104 and the second electrode 106 to the at least one further electrode 120 (not illustrated in FIG. 6).

The control device 112 may further be configured, for example, to apply an electrical signal 112s between the first electrode 104 and the second electrode 106, between the first electrode 104 and the further electrode 120, and/or between the second electrode 106 and the further electrode 120. In each case, the applied electrical signal may be configured in the same or similar manner as the signal 112s described herein that is used to form the electrical connection 110 between the first electrode 104 and the second electrode 106.

Figure 7:
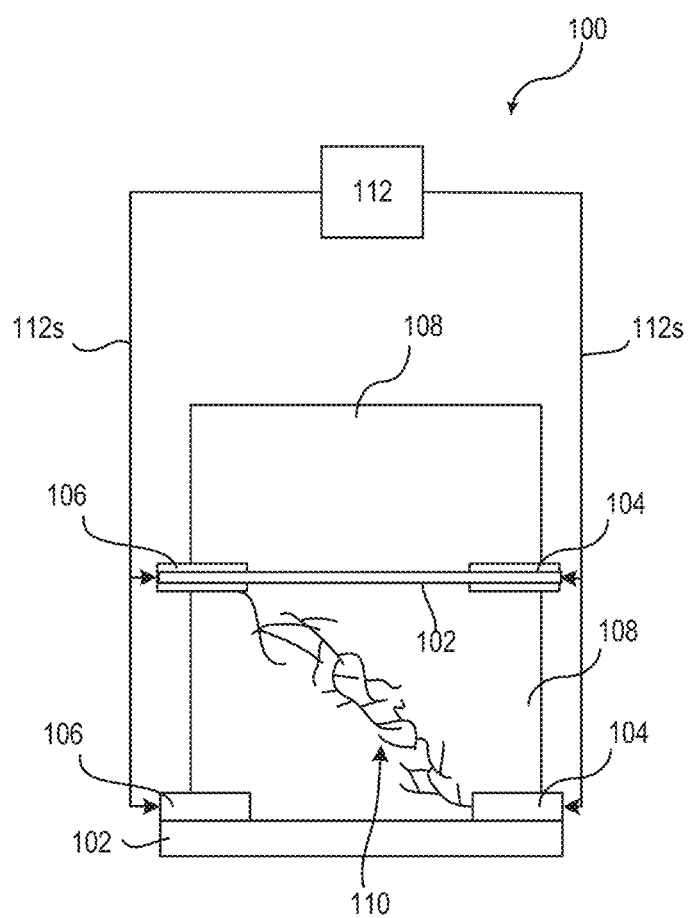
FIG. 7 shows several electronic components in a schematic view, according to various aspects.

FIG. 7 shows an electronic component 100 in a schematic view, according to various aspects.

According to various aspects, the electronic device 100 may include a plurality of substrates 102. The plurality of substrates 102 may be configured, for example, one above the other and/or side by side, wherein each of the plurality of substrates 102 may include a plurality of electrodes 104, 106, which may be spaced apart on or within the respective substrate 102.

Further, the electronic device 100 may include an electrolytic material 108 disposed, for example, in at least a spatial region between the plurality of electrodes 104, 106. The electrolytic material 108 may include at least one polymerizable material, as described herein. In this regard, the electrolytic material may be in physical contact with at least a portion of the plurality of electrodes 104, 106. Further, the electronic device 100 may include a control device 112 for applying an electrical voltage between at least two of the plurality of electrodes 104, 106. The control device 112 may be configured such that at least one electrical connection 110 may be formed between the at least two electrodes 104, 106 of the respective substrate by polymerizing the at least one polymerizable material into an electrically conductive polymer.

According to various aspects, the control device 112 may be configured to apply an electrical voltage between at least one electrode 104 of a first substrate (e.g., the lower substrate 102 shown in FIG. 7) of the plurality of substrates and at least one electrode 106 of a second substrate (e.g., the upper substrate 102 shown in FIG. 7) of the plurality of substrates. For example, the control device 112 may be configured such that an electrical connection 110 between the at least one electrode 104 of the first substrate and the at least one electrode 106 of the second substrate may be established by means of polymerizing the at least one polymerizable material into an electrically conductive polymer, as illustrated in FIG. 7. In this regard, the electrical connection 110 made between the at least one electrode 104 of the first substrate and the at least one electrode 106 of the second substrate may, for example, be at least partially in physical contact with the electrolytic material 108, such as being surrounded by the electrolytic material 108.

For example, the electronic device 100 may be used in such a way that a wide range of neuromorphic properties may be mimicked in a single electronic device.

According to various aspects, for example, a plurality of electronic components 100 may be or are interconnected such that an artificial neural network is formed. The artificial neural network may, for example, include one or more electronic components 100 and be configured to perform at least one computing function by means of the one or more electronic components 100.

According to some aspects, forming the at least one electrical connection 110 may be performed as follows:

For example, an electrical voltage of less than 2 V may be used. A lower electric voltage (e.g., of −1 V) may further be applied to one or more electrodes to control the electric field and/or salt distribution in the electrolytic material, and thus the directionality of polymerization. This allows, for example, multiple compounds to form and trigger their growth with external stimuli.

The artificial neuronal network formed from an electrically conductive polymer may illustratively resemble, for example, the dendritic topology of a synapse, and the growth may be comparable to a synaptogenetic process.

The alternating current (AC) signal may be in a range of about 1 V to about 6 V and may be or be applied to the at least two electrodes, wherein the at least two electrodes are in contact with a solution containing:

Acetonitrile (MeCN), 1 mM sodium tetrabutylammonium hexafluorophosphate (TBAPF6), and 50 mM 3,4-Ethylenedioxythiophene (EDOT).

For example, polymerization may lead to the formation of poly-3,4-ethyleneedioxythiophene (PEDOT) fibers doped with hexafluorophosphate PF6.

The amplitude of the electrical signal, according to various aspects, may have little effect on the formation of the at least one electrical connection 110, provided enough electrical voltage is provided to support oxidative polymerization in PEDOT.

However, the frequency of the electrical signal may have a significant impact on the formation of the at least one electrical connection 110. For example, it has been recognized that there is a strong correlation between frequency and degree of branching of the at least one electrical connection 100, as shown for example in FIG. 2. Frequencies greater than 200 Hz, for example, may result in the formation of more highly branched electrical connections, and an increase in the period of the AC voltage may reduce the branching and increase the cross-sectional area of the at least one electrical connection 110.

These variations in the physical and electrical properties of the at least one electrical connection may result, for example, from the interrelated dynamics of motion of the monomers and the ions from the electrolytic material. For example, the monomers may be affected by the electrical voltage and the ions may be subject to Brownian motion.

According to various aspects, the polymerization reaction may be triggered, for example, by oxidizing the monomer, forming doped oligomers stabilized with PF6, which in turn may react with already formed PEDOT fibers. The presence of the electrolytic material and the local. e.g., positive voltage, which is larger than the oxidation potential of the monomer, may be helpful to realize the electrochemical reaction. Illustratively, ions may collect at the interface between the at least two electrodes and the electrolytic material with a certain resistance-capacitor time duration ("RC-time"). For example, a longer time duration allows more reactions to occur at the extremities of the fibers. This may lead to wider fibers. During the following cathodic moment, only the newly formed extremities of the fibers may become reactive. This effect offers, for example, the possibility of controlling the conductivity of the at least one electrical connection 110 made of electrically conductive polymer by means of structural changes.

According to other aspects, classical conditioning (e.g., Pavlov conditioning) may be enabled using the electronic device 100, as described below.

FIG. 8A, FIG. 8B, FIG. 8C, and FIG. 8D each illustrate a state of the electronic device 100, illustratively a state of the at least one electrical connection 110, as a function of the electrical signal 112s applied to the electrodes 104, 106, according to various aspects.

For classical conditioning, the electronic component 100 may have an electrical connection 812a between the first electrode 104 and the second electrode 106 prior to conditioning (see, for example, FIG. 8A) that electrically and physically connects the two electrodes 104, 106. The electronic device 100 may further include another electrode 820 that is free of an electrical connection with any of the other two electrodes 104, 106. The electrolytic material 108 may be disposed in at least one spatial region between the two electrodes 104, 106 and the further electrode 820. This may illustratively correspond to a situation of Pavlov conditioning in which a living creature (e.g., a dog) 802 responds (e.g., salivates) 806 appropriately in response to a first external stimulus (e.g., the smell of food) 804, but no physiological response is associated with another external stimulus (e.g., the sound of a bell) 808. Application of an electrical signal to the further electrode 820 may result in no output from either of the two electrodes 104, 106 in this conditioning state.

In order for the two external stimuli 804, 808 (also referred to as stimuli) to be paired together, an electrical connection would need to be formed between one of the two electrodes 104, 106 and the further electrode 820.

Figure 8A:
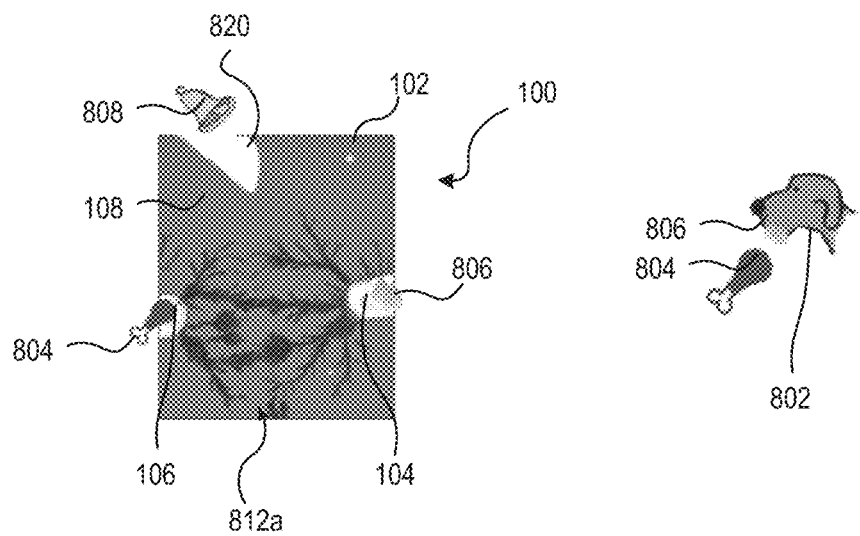
FIG. 8A shows an illustration of forming an electrical connection in response to the applied electrical signal to form the electrical connection, according to various aspects.
Figure 8B:
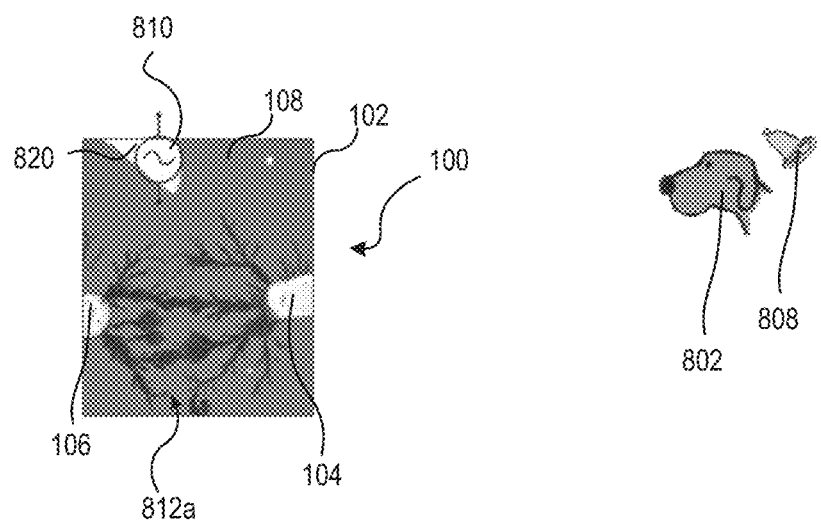
FIG. 8B shows a further illustration of forming an electrical connection in response to the applied electrical signal to form the electrical connection, according to various aspects.

For example, as illustrated in FIG. 8B, an electrical signal 810 (e.g., at 2 V and 50 Hz) may be or may be applied between the first electrode 104 and the further electrode 820. The electrical signal 810 may not initiate polymerization of the polymer material from the electrolytic material 108 in this case, as the applied electrical voltage may be selected below the electrical voltage that would be required to oxidize the monomer. In this case, when the second external stimulus 808 is applied (e.g., when the bell rings), no conditioning is initiated in the absence of the first external stimulus 804 (e.g., the feed).

Figure 8C:
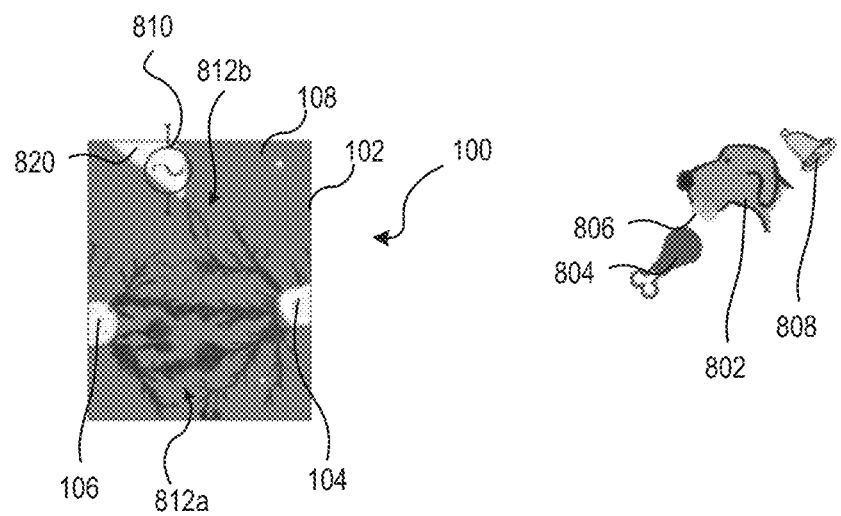
FIG. 8C shows a further illustration of forming an electrical connection in response to the applied electrical signal to form the electrical connection, according to various aspects.

As illustrated in FIG. 8C, conditioning may occur when the two external stimuli 804, 808 occur simultaneously, for example, when illustratively the bell rings and food is served to the dog. In this example, an electrical voltage lower than the threshold voltage is applied to the further electrode 820, for example, while an electrical voltage is applied between the first electrode 104 and the second electrode 106. This results, for example, in the formation of an electrical connection 812b between the first electrode 104 and the further electrode 820.

Figure 8D:
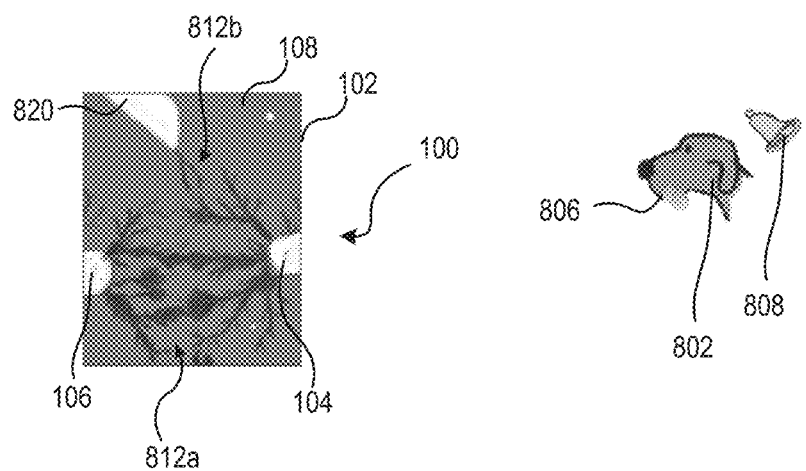
FIG. 8D shows a further illustration of forming an electrical connection in response to the applied electrical signal to form the electrical connection, according to various aspects.

FIG. 8D illustrates the electronic device 100 programmed in a manner analogous to classical conditioning. For example, when an electrical signal is applied to either the second electrode 106 or the further electrode 118, it results in an output at the first electrode 104.

According to various aspects, an illustrative bias voltage (e.g., negative) may be applied to the further electrode 820 to affect the growth between the three electrodes.

Figure 9:
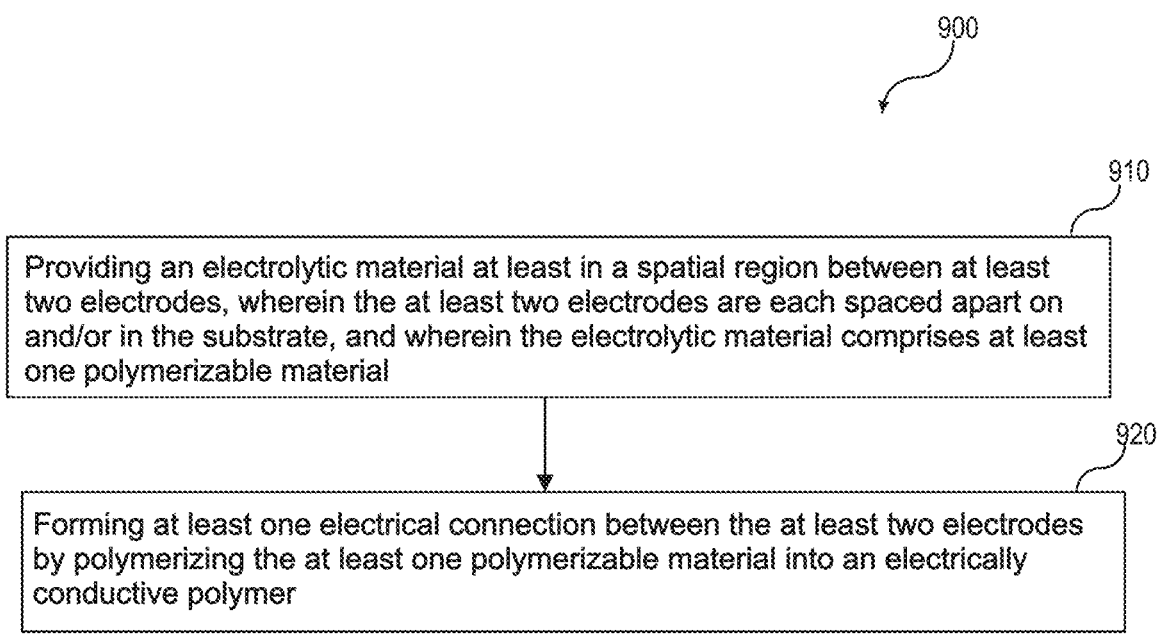
FIG. 9 shows a schematic flowchart of a method for operating an electronic device, according to various aspects.

FIG. 9 illustrates a schematic flowchart of a method of operating an electronic device, according to various aspects.

The method 900 of operating an electronic device 100 may, for example, include: in 910, providing an electrolytic material 108 at least in a spatial region between at least two electrodes 104, 106, wherein the at least two electrodes 104, 106 are each spaced apart from each other on and/or in the substrate 102, and wherein the electrolytic material 108 includes at least one polymerizable material. The method 900 may further include, for example: in 920, forming at least one electrical connection 110 between the at least two electrodes 104, 106 by polymerizing the at least one polymerizable material into an electrically conductive polymer.

It is understood that the method of operating an electronic device may include one or more functions described herein with reference to the electronic device or a portion of the electronic device (for example, the control device), and vice versa.

For example, the method of operating 900 the electronic device enables repeated programming of the electronic device with different neuromorphic characteristics.

According to various aspects, forming 920 the at least one electrical connection 110 may include applying an electrical signal between at least the first electrode 104 and the second electrode 106. For example, forming 920 the at least one electrical connection 110 between the at least two electrodes 104, 106 may include forming a single fiber structure by polymerizing the at least one polymerizable material, the fiber structure having physical contact with the at least two electrodes 104, 106. Alternatively, forming 920 the at least one electrical connection 110 between the at least two electrodes 104, 106 may include forming multiple fiber structures by polymerizing the at least one polymerizable material, the multiple fiber structures having physical contact with the at least two electrodes 104, 106.

Further, the application of the electrical signal may be such that at least the first electrode 104 is electrically connected to the second electrode 106 by means of the one or more fiber structures. Alternatively, the application of the electrical signal may be such that at least the first electrode 104 is electrically connected to the second electrode 106 by means of two or more fiber structures formed from the electrically conductive polymer.

In various aspects, the electrolytic material 108 may have a first conductivity and the at least one electrical connection 110 may have a second conductivity, where the first electrical conductivity may be less than the second electrical conductivity, for example.

In various aspects, the method 900 may further include varying the electrical conductivity of the at least one electrical connection 110 by means of applying an electrical signal between one of the first or second electrodes 104, 106 and a third electrode disposed in the electronic device 500, wherein the third electrode 116 is disposed, for example, at a distance from the first electrode 104 and the second electrode 106.

In various aspects, the method 900 may further include depolymerizing and/or disentangling the electrically conductive polymer into a depolymerized and/or disentangled polymerizable material by supplying energy 114. In this regard, the energy supply 114 may be by means of supplying thermal energy and/or by means of supplying electromagnetic radiation.

A disentangling of the electrically conductive polymer (also called "disentanglement"), for example, may be understood as the disentangling of a fiber consisting of several interwoven polymer chains, which may be understood as a kind of glass transition in polymers.

The following are some examples that relate to what is described herein and shown in the figures.

Example 1 is an electronic component including: a substrate, the substrate having at least two electrodes, the at least two electrodes each being spaced apart from one another on and/or in the substrate; wherein, when the electronic component is in a first operating state, an electrolytic material is disposed at least in a spatial region between the at least two electrodes, the electrolytic material including at least one polymerizable material; and wherein, when the electronic component is in a second operating state, at least one electrical connection is made between the at least two electrodes, the at least one electrical connection including an electrically conductive polymer. Optionally, the electrically conductive polymer may include one or more fiber structures or be formed as one or more fiber structures. For example, the one or more fiber structures may be in physical contact with the at least two electrodes.

In example 2, the electronic device of example 1 may optionally have the one fiber structure or at least one fiber structure of the plurality of fiber structures extending from the first electrode to the second electrode.

In another example 2, the electronic device of example 1 may optionally include at least one fiber structure of the plurality of fiber structures extending from the first electrode to the second electrode, and at least one other fiber structure of the plurality of fiber structures extending from the second electrode to the first electrode.

According to various aspects, the directionality of a fiber structure may be recognized by the fact that the degree of branching increases in the growth direction.

In example 3, the electronic device of example 1 or 2 may optionally include the one fiber structure or at least one fiber structure of the plurality of fiber structures including one or more strands, wherein at least one strand of the one or more strands extends from the first electrode to the second electrode.

In another example 3, the electronic device according to example 1 or 2 may optionally include the at least one strand of the one or more strands extending from the first electrode to the second electrode and the at least one strand of the one or more strands extending from the second electrode to the first electrode.

In example 4, the electronic device according to any one of examples 1 to 3 may optionally have the one fiber structure or at least one fiber structure of the plurality of fiber structures being at least singly or multiply branched.

In example 5, the electronic device according to any of examples 1 to 3 may optionally further include: a control device for providing an electrical signal to the at least two electrodes.

In example 6, the electronic component according to example 5 may optionally include that the control device is configured such that the electronic component may be brought from the first operating state to the second operating state by means of the provided electrical signal by means of polymerizing the at least one polymerizable material to the electrically conductive polymer, wherein the provided electrical signal has an amplitude of, for example, 20 mV to 5 V.

In example 7, the electronic device according to example 5 or 6 may optionally include that the provided electrical signal includes a time-varying electrical voltage, such as an AC voltage, a pulsed DC voltage, and/or a pulsed bipolar voltage.

In example 8, the electronic device of example 7 may optionally include that the time-varying electrical voltage has a frequency in a range of 10 Hz to 10 kHz.

In example 9, the electronic device according to example 7 or 8 may optionally include that the time-varying electrical voltage is a periodic electrical voltage, for example having a periodic time in a range of 0.01 ms to 0.1 s.

In example 10, the electronic device according to any one of examples 7 to 9 may optionally included that the time-varying electrical voltage has a duty cycle of 10% to 50%.

In example 11, the electronic device according to any of examples 4 to 10 may optionally include the time-varying electrical voltage has a bandwidth in a range of 10 Hz to 10 kHz.

In example 12, the electronic device according to any of examples 1 to 11 may optionally include that the electrically conductive polymer has or includes one or more fiber structures. The one or more fiber structures may be, for example, net-shaped.

In example 13, the electronic device according to any one of examples 1 to 12 may optionally include that an electrical conductivity of the electrolytic material is less than an electrical conductivity of the at least one electrical connection.

In example 14, the electronic device according to any of examples 1 to 13 may optionally include that the electrically conductive polymer is at least partially free of physical contact with the substrate. For example, one or more longitudinal portions of the fibers of a fiber structure may be fully surrounded by the electrolytic material. For example, one or more longitudinal portions of the fibers of a fibrous structure may be entirely free of physical contact with the substrate.

In example 15, the electronic device according to any of examples 1 to 14 may optionally include the electrolytic material being substantially free of the electrically conductive polymer when the electronic device is in the first operating state.

According to a sixteenth example, the control device may further be configured to be brought from the second operating state to the first operating state by means of the provided electrical signal.

According to a seventeenth example, the control device may further be configured to provide an electrical voltage between the at least two electrodes such that by means of the electrical voltage the electrically conductive polymer of the at least one electrical connection is formed from the at least one polymerizable material of the electrolytic material.

In example 18, the electronic device according to any of examples 1 to 17 may optionally include the electrolytic material being configured such that the electronic device may be brought from the second operating state to the first operating state by means of the provided electrical signal.

In example 19, the electronic device according to any of examples 1 to 18 may optionally include forming the electrically conductive polymer by polymerizing the at least one polymerizable material of the electrolytic material.

In example 20, the electronic device according to any of examples 1 to 19 may optionally include that the electrical connection is formed by electropolymerization.

In example 21, the electronic device according to any of examples 1 to 20 may optionally include that the electrolytic material is configured such that depolymerization and/or disentangling of the electrically conductive polymer may be performed by means of an energy supply.

In example 22, the electronic device according to any one of examples 1 to 21 may further be configured such that depolymerization and/or disentangling of the electrically conductive polymer may be performed by means of an energy supply.

In example 23, the electronic device according to example 21 or 22 may optionally include that the energy supply is provided by means of a thermal energy supply.

In example 24, the electronic device according to any one of examples 21 to 23 may further be configured such that the energy supply is provided by means of electromagnetic radiation.

In example 25, the electronic device according to any of examples 1 to 24 may optionally include the substrate including or consisting of a semiconductor material.

In example 26, the electronic device according to any of examples 1 to 25 may optionally include the substrate including or consisting of an electrically insulating material, for example SiO2.

In example 27, the electronic device according to any of examples 1 to 26 may optionally include that the electrolytic material includes a liquid electrolyte, such as an ionic liquid, or that the electrolytic material includes a carbonate-based electrolyte, or that the electrolytic material includes a polymer electrolyte; or that the electrolytic material includes a porous electrolyte solid.

In example 28, the electronic device according to any of examples 1 to 27 may optionally include that the polymerizable material is a monomer of an intrinsically conductive polymer and/or a doped polymer, and that the electrically conductive polymer is the intrinsically conductive polymer or the doped polymer, respectively. The intrinsically conductive polymer may have or be, for example, poly(3,4-ethylenedioxythiophene). The monomer may have or be, for example, 3,4-ethyleneedioxythiophene.

In example 29, the electronic component according to any of examples 1 to 28 may optionally include: a gate structure or a further electrode for influencing the electrical conductivity of the established electrical connection by means of an electric field. For example, a control device may be configured to provide an electrical voltage to the gate structure or the further electrode such that by means of the electrical voltage the electrical conductivity of the at least one electrical connection may be changed.

In example 30, the electronic device of example 29 may optionally have the one fiber structure or at least one fiber structure of the plurality of fiber structures extending from the first electrode to the further electrode.

In example 31, the electronic device according to example 29 or 30 may optionally have the one fiber structure or at least one fiber structure of the plurality of fiber structures extending from the second electrode to the further electrode.

In example 32, the electronic device according to any of examples 29 to 31 may optionally include the one fiber structure or at least one fiber structure of the plurality of fiber structures including one or more strands, wherein at least one strand of the one or more strands extends from the first electrode to the further electrode.

According to various aspects, strands of a fibrous structure may also be understood as the fibers of the fibrous structure. In other words, the fiber structure may be understood as a strand structure.

In example 33, the electronic device according to any of examples 29 to 32 may optionally include the one fiber structure or at least one fiber structure of the plurality of fiber structures including one or more strands, wherein at least one strand of the one or more strands extends from the second electrode to the further electrode.

In example 34, the electronic device according to any of examples 29 to 33 may optionally include that the gate structure includes or is a liquid electrolyte, a polymer electrolyte, a metal contact, and/or a contact made of an electrically conductive organic material.

In example 35, the electronic device according to any of examples 1 to 34 may optionally include the at least two electrodes spaced less than 200 μm apart.

In example 36, the electronic device according to any of examples 1 to 35 may optionally include that the electrolytic material includes mobile ions for providing short-term plasticity of the at least one electrical connection.

In example 37, the electronic device according to any of examples 1 to 36 may optionally include that the electrically conductive polymer of the at least one electrical connection has long-term plasticity.

In example 38, the electronic device according to any of examples 1 to 37 may optionally include: a metallization for connecting the at least two electrodes to at least one biological nerve.

Example 39 is an electronic device including: a substrate, a first electrode and a second electrode spaced apart from each other on or in the substrate; an electrolytic material disposed in at least a spatial region between the first electrode and the second electrode, the electrolytic material including at least one polymerizable material; a control device for applying an electrical voltage between the first electrode and the second electrode, the control device being configured such that at least one electrical connection between at least the first electrode and the second electrode may be established by polymerizing (e.g. electropolymerizing) the at least one polymerizable material into an electrically conductive polymer.

In example 40, the electronic device according to example 33 may optionally include: a third electrode. The control device may be configured to influence the formation of the at least one electrical connection between at least the first electrode and the second electrode by means of an electrical signal provided to the third electrode.

In example 41, the electronic device according to example 40 may optionally include the electronic device having at least three electronic operating states considering the third electrode.

Example 42 is an electronic device including: a plurality of substrates disposed one above the other. For example, each of the plurality of substrates may include: a plurality of electrodes disposed on or in the substrate at a distance from each other; and an electrolytic material disposed in at least a spatial region between the plurality of electrodes, the electrolytic material including at least one polymerizable material. The electronic device may further include: a control device for applying an electrical voltage between at least two of the plurality of electrodes of the respective substrate of the plurality of substrates, the control device being configured such that at least one electrical connection between the at least two electrodes of the respective substrate may be formed by polymerizing (for example, by electropolymerizing) the at least one polymerizable material into an electrically conductive polymer. The control device may further be configured to apply an electrical voltage between at least one electrode of a first substrate of the plurality of substrates and at least one electrode of a second substrate of the plurality of substrates, wherein the control device is configured such that an electrical connection may be formed between the at least one electrode of the first substrate and the at least one electrode of the second substrate by means of polymerizing (for example by means of electropolymerizing) the at least one polymerizable material into an electrically conductive polymer.

According to another example, the electronic component may include an encapsulation, e.g., made of a glazing material, wherein the encapsulation partially or completely encapsulates at least the respective electrodes, the substrate, and the electrolytic material.

According to another example, the substrate of the electronic device may be an ion-conductive substrate. Illustratively, the substrate may include or consist of an ion-conductive material.

According to another example, each of the at least two electrodes 104, 106 may be electrically insulated in sections from the electrolytic material 108. For example, at least a portion of the respective electrode 104, 106 may be covered by means of an electrically insulating layer 107 and thus electrically insulated from the electrolytic material 108.

Example 43 is an artificial neural network including: one or more electronic devices according to any of examples 1 to 42. The artificial neural network may be configured, for example, to perform at least one computational function by means of the one electronic device or by means of the plurality of electronic devices.

Example 44 is a method of operating an electronic device, the method including: providing an electrolytic material at least in a spatial region between at least two electrodes, wherein the at least two electrodes are each spaced apart from each other on and/or in the substrate, and wherein the electrolytic material includes at least one polymerizable material; forming at least one electrical connection between the at least two electrodes by polymerizing the at least one polymerizable material into an electrically conductive polymer. Optionally, the formed electrically conductive polymer may include one or more fiber structures. The one or more fiber structures may be in physical contact with the at least two electrodes.

In example 45, the method of example 44 may optionally include forming the at least one electrical connection between the at least two electrodes: forming a single fiber structure by polymerizing the at least one polymerizable material, the fiber structure having physical contact with the at least two electrodes; or forming multiple fiber structures by polymerizing the at least one polymerizable material, the multiple fiber structures having physical contact with the at least two electrodes.

In example 46, the method of example 44 or 45 may optionally include the electrical conductivity of the electrolytic material being less than the electrical conductivity of the at least one electrical connection.

In example 47, the method according to any one of examples 44 to 46 may optionally include forming the at least one electrical connection by applying an electrical signal between at least the first electrode and the second electrode.

In example 48, the method according to example 47 may optionally include applying an electrical signal such that polymerizing the at least one polymerizable material includes alternately polymerizing the at least one polymerizable material on the first electrode and the second electrode.

In example 49, the method according to example 47 may optionally include applying an electrical signal such that a fiber structure or at least one fiber structure of the plurality of fiber structures grows from the first electrode to the second electrode.

In example 50, the method according to example 47 may optionally include applying an electrical signal such that a fiber structure or at least one fiber structure of the plurality of fiber structures grows from the second electrode to the first electrode.

In example 51, the method according to example 51 may optionally include applying an electrical signal such that one fiber structure or at least one fiber structure of the plurality of fiber structures grows from the first electrode to the second electrode and another fiber structure or at least one other fiber structure of the plurality of fiber structures grows from the second electrode to the first electrode.

In example 52, the method according to example 47 may optionally include applying an electrical signal such that the one fiber structure or at least one fiber structure of the plurality of fiber structures includes one or more strands, wherein at least one strand of the one or more strands grows from the first electrode to the second electrode.

In another example 53, the electronic device according to example 47 may optionally include applying an electrical signal such that the one fiber structure or at least one fiber structure of the plurality of fiber structures includes one or more strands, wherein at least one strand of the one or more strands grows from the second electrode to the first electrode.

In another example 54, the electronic device according to example 47 may optionally include applying an electrical signal such that the one fiber structure or at least one fiber structure of the plurality of fiber structures includes one or more strands, wherein at least one strand of the one or more strands grows from the first electrode to the second electrode and at least one other strand of the one or more strands grows from the second electrode to the first electrode.

In example 54, the method according to any of examples 47 to 53 may optionally include applying an electrical signal such that the at least one electrical connection grows alternately on the first electrode and the second electrode.

In an example 55, the method according to any of examples 47 to 54 may optionally include applying the electrical signal such that at least the first electrode is electrically connected to the second electrode by means of the one or more fiber structures.

In example 56, the method of any one of examples 44 to 55 may optionally include that the at least one electrical connection has an electrical conductivity, and the method further includes: changing the electrical conductivity of the at least one electrical connection by applying an electrical signal between one of the first electrode or the second electrode and a third electrode disposed in the electronic device, the third electrode disposed at a distance from the first electrode and the second electrode.

In example 57, the method according to any of the examples 47 to 56 may optionally include applying the electrical signal such that at least the first electrode is electrically connected to the second electrode by means of two or more fiber structures formed from the electrically conductive polymer.

In example 58, the process according to any of examples 44 to 57 may optionally include: Depolymerizing and/or disentangling the electrically conductive polymer to form a depolymerized and/or disentangled polymerizable material by means of an energy supply.

In example 59, the method according to example 58 may optionally include that the energy supply is provided by supplying thermal energy.

In example 60, the method according to example 58 or 59 may optionally include that the energy supply is provided by supplying electromagnetic radiation.

Example 61 is a method of operating an electronic device, the method including: providing an electrolytic material at least in a spatial region between at least three electrodes, wherein the at least three electrodes are each configured on and/or in the substrate at a distance from each other and wherein the electrolytic material includes at least one polymerizable material, forming at least one electrical connection between a first and a second electrode of the at least three electrodes by means of polymerizing the at least one polymerizable material to an electrically conductive polymer and forming at least one electrical connection between a third electrode of the at least three electrodes and the first or the second electrode by polymerizing the at least one polymerizable material into an electrically conductive polymer.

According to various aspects, a three-dimensional structure may be formed from a plurality of electrodes. In this case, for example, a substrate may be dispensed with and the electrodes may be held in position in any suitable manner.

Example 62 is an electronic device including: a three-dimensional structure including a plurality of electrodes: wherein, when the electronic device is in a first operating state, an electrolytic material is disposed at least in a spatial region between the electrodes of the plurality of electrodes, the electrolytic material including at least one polymerizable material; and wherein, when the electronic device is in a second operating state, at least one electrical connection is made between at least two electrodes of the plurality of electrodes, the at least one electrical connection being made of an electrically conductive polymer.

The invention claimed is:

1. An electronic component comprising:
a substrate, the substrate having at least two electrodes, the at least two electrodes each being spaced apart on and/or in the substrate;
wherein, when the electronic device is in a first operating state, an electrolytic material is disposed at least in a spatial region between the at least two electrodes, the electrolytic material comprising at least one polymerizable material;
wherein, when the electronic device is in a second operating state, at least one electrical connection is made between the at least two electrodes, the at least one electrical connection being made of an electrically conductive polymer; and
wherein the electrically conductive polymer comprises one or more fibrous structures, the one or more fibrous structures being in physical contact with the at least two electrodes,
wherein the one or more fibrous structures are singly or multiply branched,
wherein each fibrous structure of the one or more fibrous structures comprise a plurality of interwoven polymer chains.

2. The electronic component according to claim 1, further comprising:
a control device for providing an electrical signal to the at least two electrodes such that the electronic component may be brought from the first operating state to the second operating state by means of the provided electrical signal by polymerizing the at least one polymerizable material into the electrically conductive polymer.

3. The electronic component according to claim 2,
wherein the provided electrical signal has an electrical voltage that varies with time,
wherein, preferably, the time-varying electrical voltage has a frequency in a range of 10 Hz to 10 kHz;
wherein, preferably, the time-varying electrical voltage has a period in a range of 0.01 ms to 0.1 s;
wherein, preferably, the time-varying electrical voltage has a duty cycle of 10% to 50%; and/or
wherein, preferably, the time-varying electrical voltage has a bandwidth in a range of 10 Hz to 10 kHz.

4. The electronic component according to claim 2,
wherein the control device is further configured such that the electronic component may be brought from the second operating state to the first operating state by means of the provided electrical signal.

5. The electronic component according to claim 1,
wherein each of the at least two electrodes is electrically insulated in sections from the electrolytic material.

6. The electronic component according to claim 1,
wherein the electrically conductive polymer is completely free of physical contact with the substrate in at least a section thereof.

7. The electronic component according to claim 1,
wherein, in the first operating condition of the electronic device, the electrolytic material is substantially free of the electrical connection of the electrically conductive polymer.

8. The electronic component according to claim 1,
wherein the electrolytic material is such that depolymerization and/or disentangling of the electrically conductive polymer may be effected by means of energy supply; and/or wherein the electronic component is configured such that depolymerization and/or disentangling of the electrically conductive polymer may be performed by means of energy supply.

9. The electronic component according to claim 1, wherein the substrate comprises or consists of an ion conducting material.

10. The electronic component according to claim 1, further comprising:
a gate structure for influencing the electrical conductivity of the manufactured electrical connection by means of an electric field.

11. The electronic component according to claim 10, wherein the electronic component is configured such that an electrical voltage may be provided to the gate structure such that by means of the electrical voltage the electrical conductivity of the at least one electrical connection is changed.

12. The electronic component according to claim 1, further comprising:
a metallization for connecting the at least two electrodes to at least one biological nerve.

13. The electronic component according to claim 1, further comprising:
a third electrode,
wherein the electronic component is further configured such that the forming of the at least one electrical connection between at least the first electrode and the second electrode may be influenced by means of an electrical signal provided to the third electrode.

14. An electronic component comprising:
a plurality of substrates disposed one above the other, each of the plurality of substrates comprising:
a plurality of electrodes spaced apart from one another on or in the substrate, and
an electrolytic material disposed in at least a spatial region between the plurality of electrodes, the electrolytic material comprising at least one polymerizable material; and
a control device for applying an electrical voltage between at least two of the plurality of electrodes of the respective substrate of the plurality of substrates, the control device being configured such that at least one electrical connection may be formed between the at least two electrodes of the respective substrate by electropolymerizing the at least one polymerizable material into an electrically conductive polymer,
wherein the electrically conductive polymer comprises one or more fibrous structures, the one or more fibrous structures being in physical contact with the at least two electrodes,
wherein the one or more fibrous structures are singly or multiply branched,
wherein each fibrous structure of the one or more fibrous structures comprise a plurality of interwoven polymer chains.

15. The electronic component according to claim 14, wherein the control device is further configured to apply an electrical voltage between at least one electrode of a first substrate of the plurality of substrates and at least one electrode of a second substrate of the plurality of substrates, wherein the control device is configured to establish an electrical connection between the at least one electrode of the first substrate and the at least one electrode of the second substrate by electropolymerizing the at least one polymerizable material into an electrically conductive polymer.

16. A method of operating an electronic device, the method comprising:
providing an electrolytic material at least in a spatial region between at least two electrodes, wherein the at least two electrodes are each configured on and/or in the substrate at a distance from each other and wherein the electrolytic material comprises at least one polymerizable material, and
forming at least one electrical connection between the at least two electrodes by polymerizing the at least one polymerizable material into an electrically conductive polymer;
wherein the formed electrically conductive polymer comprises one or more fibrous structures, the one or more fibrous structures being in physical contact with the at least two electrodes,
wherein the one or more fibrous structures are singly or multiply branched,
wherein each fibrous structure of the one or more fibrous structures comprise a plurality of interwoven polymer chains.

17. The method according to claim 16, wherein forming the at least one electrical connection is performed by applying an electrical signal between at least the first electrode and the second electrode.

18. The method according to claim 16, wherein the forming of the at least one electrical connection between the at least two electrodes comprises:
forming a single fibrous structure by polymerizing the at least one polymerizable material, the fibrous structure having physical contact with the at least two electrodes, or
forming a plurality of fibrous structures by polymerizing the at least one polymerizable material, the plurality of fibrous structures having physical contact with the at least two electrodes.

19. The electronic component of claim 1, wherein the at least two electrodes are spaced apart by less than 200 μm.

* * * * *